(12) United States Patent
Takada et al.

(10) Patent No.: US 11,821,955 B2
(45) Date of Patent: Nov. 21, 2023

(54) LOAD ESTIMATION DEVICE AND PORTABLE POWER-SUPPLYING DEVICE

(71) Applicant: HONDA MOTOR CO., LTD., Tokyo (JP)

(72) Inventors: Sho Takada, Wako (JP); Nobuyuki Sasaki, Wako (JP); Mitsuhiro Ito, Wako (JP); Mio Oshima, Wako (JP); Yoshihiro Matsunaga, Wako (JP); Ryo Oshima, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 697 days.

(21) Appl. No.: 17/016,536

(22) Filed: Sep. 10, 2020

(65) Prior Publication Data

US 2020/0408847 A1    Dec. 31, 2020

Related U.S. Application Data

(63) Continuation of application No. PCT/JP2018/044963, filed on Dec. 6, 2018.

(30) Foreign Application Priority Data

Mar. 20, 2018 (JP) ................................. 2018-052595

(51) Int. Cl.
*G01R 31/3842* (2019.01)
*G01R 31/388* (2019.01)
(Continued)

(52) U.S. Cl.
CPC ......... *G01R 31/3842* (2019.01); *G01R 21/06* (2013.01); *G01R 31/388* (2019.01); *A47J 27/004* (2013.01)

(58) Field of Classification Search
CPC .. G01R 31/3842; G01R 21/06; G01R 31/388; G01R 21/133; A47J 27/004;
(Continued)

(56) References Cited

U.S. PATENT DOCUMENTS 9,568,901 B2 * 2/2017 Hooshmand ............... H02J 3/00
2007/0188144 A1 * 8/2007 Hara ..................... H02J 7/0048
320/132

(Continued)

FOREIGN PATENT DOCUMENTS

JP  2000-292465 A  10/2000
JP  2007-3296 A    1/2007
(Continued)

OTHER PUBLICATIONS

International Search Report dated Feb. 5, 2019, issued in counterpart International Application No. PCT/JP2018/044963 (2 pages).

*Primary Examiner* — M Baye Diao
(74) *Attorney, Agent, or Firm* — WHDA, LLP

(57) ABSTRACT

A load estimation device measures a voltage and a current supplied to a load connected to a portable power-supply, obtains a feature amount of the load from the voltage and the current. The device obtains a stored feature amount of each of loads, and related load information indicating a plurality of loads which are used in association with each other. The device estimates a load connected to the power-supply on the basis of the obtained feature amount and a stored feature amount, and predicts a load which is not connected to the power-supply and which is a load related to the estimated load on the basis of the related load information.

7 Claims, 13 Drawing Sheets

(51) Int. Cl.
*G01R 21/06* (2006.01)
*A47J 27/00* (2006.01)

(58) Field of Classification Search
CPC .... H02J 7/1492; H02J 2310/70; H02J 7/0048; H02J 7/0063; Y02E 60/10; F02B 63/04; H01M 10/42
USPC ........................................................ 320/132
See application file for complete search history.

(56) References Cited

U.S. PATENT DOCUMENTS

| | | | |
|---|---|---|---|
| 2013/0049468 A1 | 2/2013 | Iwasaki et al. | |
| 2013/0069448 A1* | 3/2013 | Otsuka | G01R 31/3842 307/131 |
| 2013/0134940 A1 | 5/2013 | Tominaga | |
| 2013/0198541 A1 | 8/2013 | Rabii | |
| 2014/0081474 A1* | 3/2014 | Blakeley | G06F 1/26 700/291 |
| 2015/0046103 A1 | 2/2015 | Abe et al. | |
| 2015/0134279 A1 | 5/2015 | Kim et al. | |
| 2015/0241487 A1 | 8/2015 | Bozzi et al. | |
| 2018/0145883 A1* | 5/2018 | Kaneko | G06F 9/4881 |

FOREIGN PATENT DOCUMENTS

| | | | | |
|---|---|---|---|---|
| JP | 2012-189526 A | | 10/2012 | |
| JP | 2013-251102 A | | 12/2013 | |
| JP | 2014003749 A | * | 1/2014 | ............ Y02B 70/30 |
| JP | 2015-512077 A | | 4/2015 | |
| JP | 2018205309 A | * | 12/2018 | ............ G01R 31/36 |
| WO | 2011/142330 A1 | | 11/2011 | |
| WO | WO-2011142330 A1 | * | 11/2011 | ............ H02J 3/383 |
| WO | 2012/020756 A1 | | 2/2012 | |
| WO | 2013/157294 A1 | | 10/2013 | |

* cited by examiner

FIG. 6

| LOAD IDENTIFICATION INFORMATION | RATED POWER CONSUMPTION [W] | TYPICAL POWER AMOUNT [Wh] |
|---|---|---|
| LIGHTING FIXTURE | 10 | NA |
| RICE COOKER | 400 | 200 |
| COMPRESSOR | 700 | 70 |
| ELECTRIC KETTLE | 800 | 40 |
| HEATER | 900 | NA |
| DRYER | 1000 | 50 |

LOAD ESTIMATION DEVICE AND PORTABLE POWER-SUPPLYING DEVICE

CROSS-REFERENCE TO RELATED APPLICATION(S)

This application is a continuation of International Patent Application No. PCT/JP2018/044963 filed on Dec. 6, 2018, which claims priority to and the benefit of Japanese Patent Application No. 2018-052595 filed on Mar. 20, 2018, the entire disclosures of which are incorporated herein by reference.

BACKGROUND OF THE INVENTION

Field of the Invention

The present invention relates to a load estimation device which estimates a load connected to a portable power-supplying device such as a generator or a storage battery.

Description of the Related Art

A variety of loads (electrical devices) are connected to a generator. An engine-driven generator can no longer generate power when its fuel has been exhausted. With a rice cooker, for example, if the fuel is exhausted before the rice finishes cooking, not only will there be no rice to eat, but the uncooked rice will be wasted as well. Accordingly, if the type, name, and so on of the load connected to a generator can be estimated, it can be determined whether or not enough fuel is left to supply a sufficient amount of power to the load.

PTL 1 describes determining the operating state of an electrical device by training a neural network on the fundamental harmonics, higher harmonics, and the like of currents and operating states of electrical devices. PTL 2 describes determining whether or not a load is in a state of operation by analyzing the frequencies of fundamental harmonics, higher harmonics, or the like of a current.

CITATION LIST

Patent Literature

PTL 1: Japanese Patent Laid-Open No. 2000-292465
PTL 2: Japanese Patent Laid-Open No. 2007-003296

According to PTL 1, a large amount of training data is required in order to train the neural network. Furthermore, PTL 1 does not identify the type of the load to begin with. PTL 2 requires frequency analysis, which involves a large amount of processing. Furthermore, PTL 2 also does not identify the type of the load to begin with. An object of the present invention is to estimate the type of a load connected to a portable power-supplying device on the basis of a feature amount of the load. A further object of the present invention is to predict, on the basis of a load which has already been connected to a portable power-supplying device and which has been estimated, a load which may be connected to the power-supplying device.

SUMMARY OF THE INVENTION

The present invention provides, for example, a load estimation device including: a measuring circuit configured to measure a voltage and a current supplied to a load connected to a portable power-supplying device; a computing unit configured to compute a feature amount of the load from a measured value of the voltage and a measured value of the current measured by the measuring circuit; a storage device configured to store, in advance, a feature amount of each of loads, and related load information indicating a plurality of loads which are used in association with each other; a load estimating unit configured to estimate a load connected to the power-supplying device on the basis of the feature amount computed by the computing unit and a feature amount stored in the storage device; and a load predicting unit configured to, on the basis of the related load information, predict a load which is not connected to the power-supplying device and which is a load related to the load estimated by the load estimating unit.

Further features of the present invention will become apparent from the following description of exemplary embodiments (with reference to the attached drawings).

BRIEF DESCRIPTION OF DRAWINGS

FIG. 6 is a diagram illustrating power data.

DESCRIPTION OF THE EMBODIMENTS

Power-Supplying Device

A power-supplying device is a device which is capable of supplying power to one or more loads (electrical devices). The power-supplying device is, for example, an engine-driven generator, a storage battery, or an engine-driven generator including a storage battery. As such, the power-supplying device may be a portable power-supplying device. For example, the power-supplying device may be usable outdoors, such as at a camping ground. Such a power-supplying device does not receive commercial AC power, and is independent from commercial AC power. For example, an engine-driven generator can supply power to a load for as long as there is remaining fuel. Meanwhile, a storage battery can supply power to a load as long as there is a remaining charge. Furthermore, an engine-driven generator including a storage battery can supply power to a load as long as there is remaining fuel and a remaining charge. Note that the rated power consumption, amount of power to be consumed, and so on differ depending on the type of the load. For example, a rice cooker consumes a large amount of power at the start of the cooking period, and consumes less power during a steaming period. Note that a typical amount of power required by a rice cooker from the start to the end of rice cooking is known. For an electric kettle too, the amount of power required to bring a defined amount of water to a boil is known (the boiling point, which depends on the altitude, may be taken into account as well). Accordingly, if the load can be estimated, it can be determined, on the basis of the remaining amount of fuel and so on, whether or not the main objective of the electrical device (e.g., a typical task such as cooking rice or boiling water) can be achieved. There are some products, such as lighting, heaters, and air compressors, for which the usage time varies greatly depending on the user. In such a case, the time for which the electrical device can operate continuously can be calculated on the basis of the rated power consumption of the electrical device, the remaining amount of fuel, and so on. By stopping one of the loads in accordance with this continuous operation time, the user may cause a specific load to operate preferentially.

Figure 1:
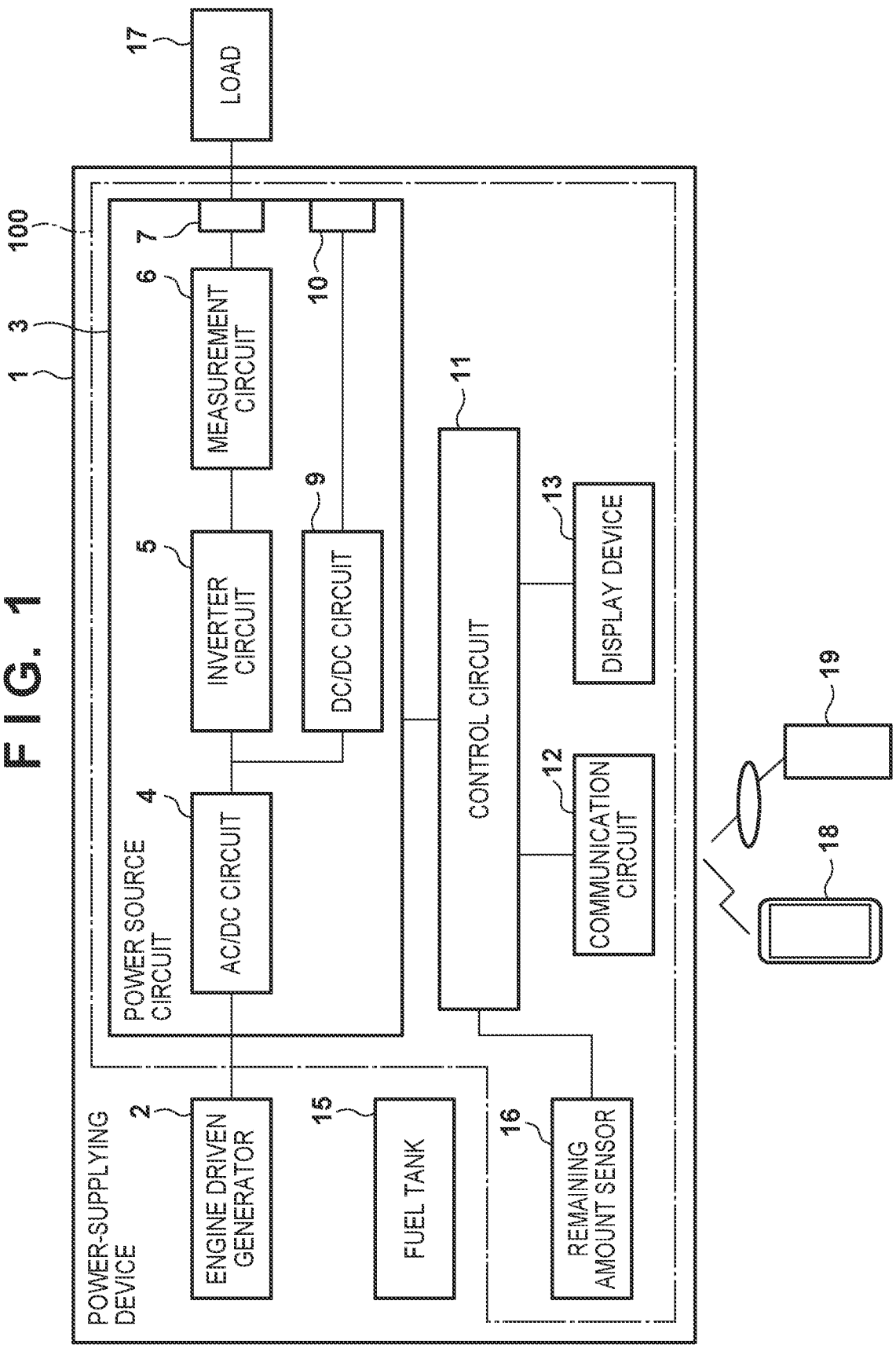
FIG. 1 is a diagram illustrating an example of the configuration of a power-supplying device.

FIG. 1 is a block diagram illustrating a power-supplying device 1. An engine-driven generator 2 is a generator in which an engine running on fuel supplied from a fuel tank 15 drives a generator to generate power. The fuel is gasoline, liquefied petroleum gas, hydrogen, or the like, for example. A power source circuit 3 is a circuit that converts a voltage generated by the engine-driven generator 2 into a predetermined AC voltage or DC voltage. An AC/DC circuit 4 includes a rectifying and smoothing circuit which rectifies and smooths the AC voltage generated by the engine-driven generator 2. An inverter circuit 5 is a circuit that transforms DC voltage output from the AC/DC circuit 4 into a stable AC voltage having a predetermined frequency. A measurement circuit 6 measures AC voltage and AC current supplied to a load 17 connected to an AC outlet 7, and outputs a measurement result to a control circuit 11. The AC outlet 7 may include a plurality of receptacles to enables a plurality of loads 17 to be connected. Additionally, a power strip may be connected to the AC outlet 7, and the plurality of loads 17 may be connected to the power strip. A DC/DC circuit 9 converts a level of DC voltage output from the AC/DC circuit 4, and supplies an operating voltage to the control circuit 11 and the like, outputs the operating voltage from a DC outlet 10, and so on. The control circuit 11 is a circuit that controls the power source circuit 3, a communication circuit 12, a display device 13, and the like. The communication circuit 12 is a circuit that communicates with a smartphone 18, a PC (personal computer) 19, and the like over a wire or wirelessly. The PC 19 may be a server device connected to the internet. The display device 13 outputs information indicating a type of a load, a continuously-operable time, and the like to a user. The display device 13 may include a touch panel-type input device. A remaining amount sensor 16 measures a remaining amount of fuel held in the fuel tank 15, and outputs a measurement result to the control circuit 11. On the basis of the measurement result from the measurement circuit 6, the control circuit 11 calculates feature amounts of a plurality of loads, and estimates the plurality of loads (the types, names, and so on thereof) on the basis of the feature amounts. The control circuit 11 determines the continuously-operable time of a load on the basis of the remaining amount of fuel, the power consumed by the load, and so on.

Figure 2:
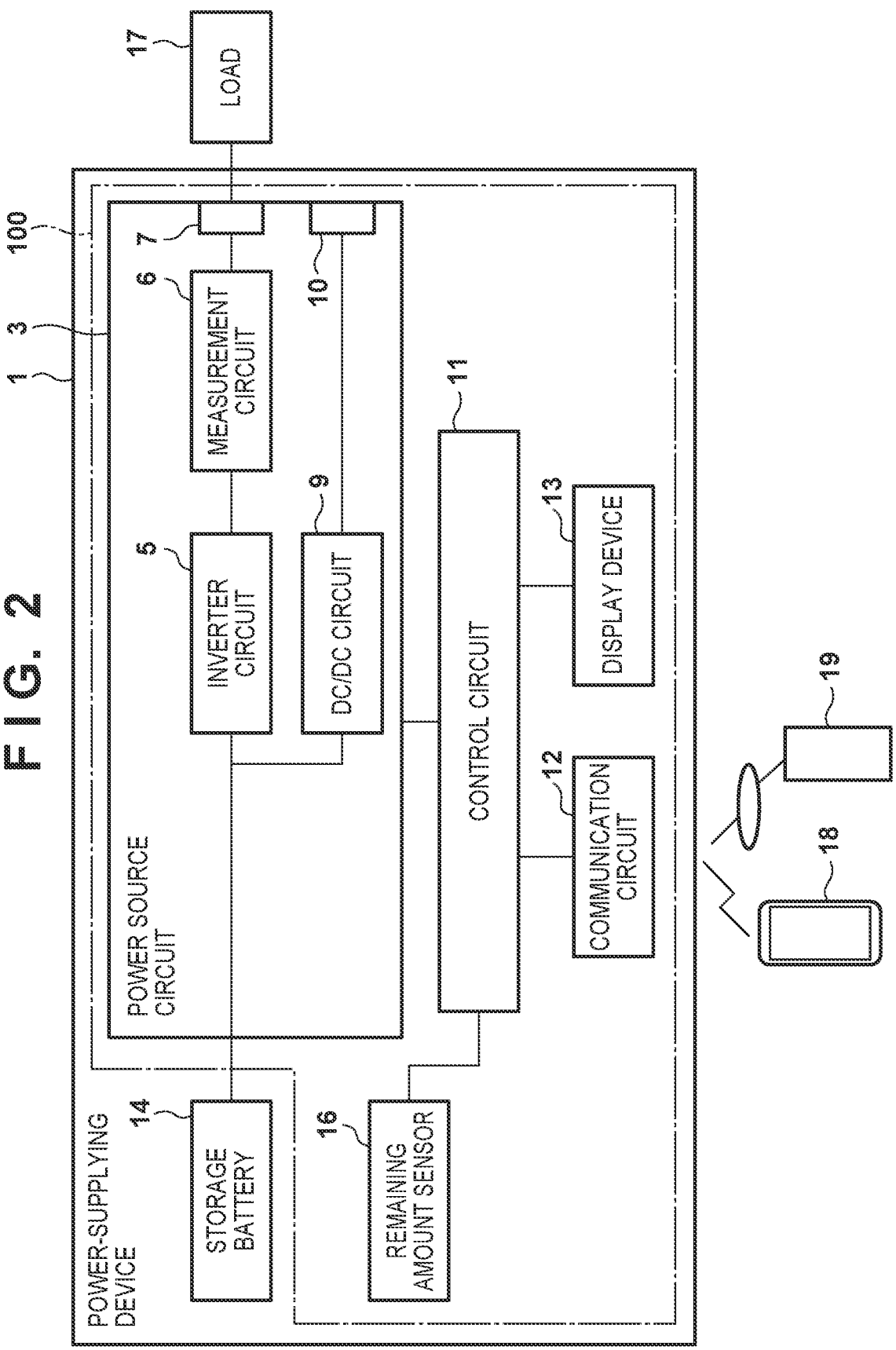
FIG. 2 is a diagram illustrating an example of the configuration of a power-supplying device.

FIG. 2 illustrates a power-supplying device 1 which employs a storage battery 14 instead of the engine-driven generator 2. Parts in FIG. 2 which are the same as in FIG. 1 will not be described here. The storage battery 14 outputs, for example, a DC voltage of 48 V or the like to the inverter circuit 5, the DC/DC circuit 9, and so on. The remaining amount sensor 16 measures a charge (Ah) in the storage battery 14 by monitoring a voltage (V) of the storage battery 14. Generally speaking, the charge and voltage of the storage battery 14 are in a correlation relationship. The remaining amount sensor 16 converts the voltage in the storage battery 14 into a charge in accordance with this correlation relationship. The control circuit 11 determines a time for which a load can operate continuously ("continuous operation time" hereinafter) on the basis of the charge remaining in the storage battery, the power consumed by the load, and so on.

Figure 3:
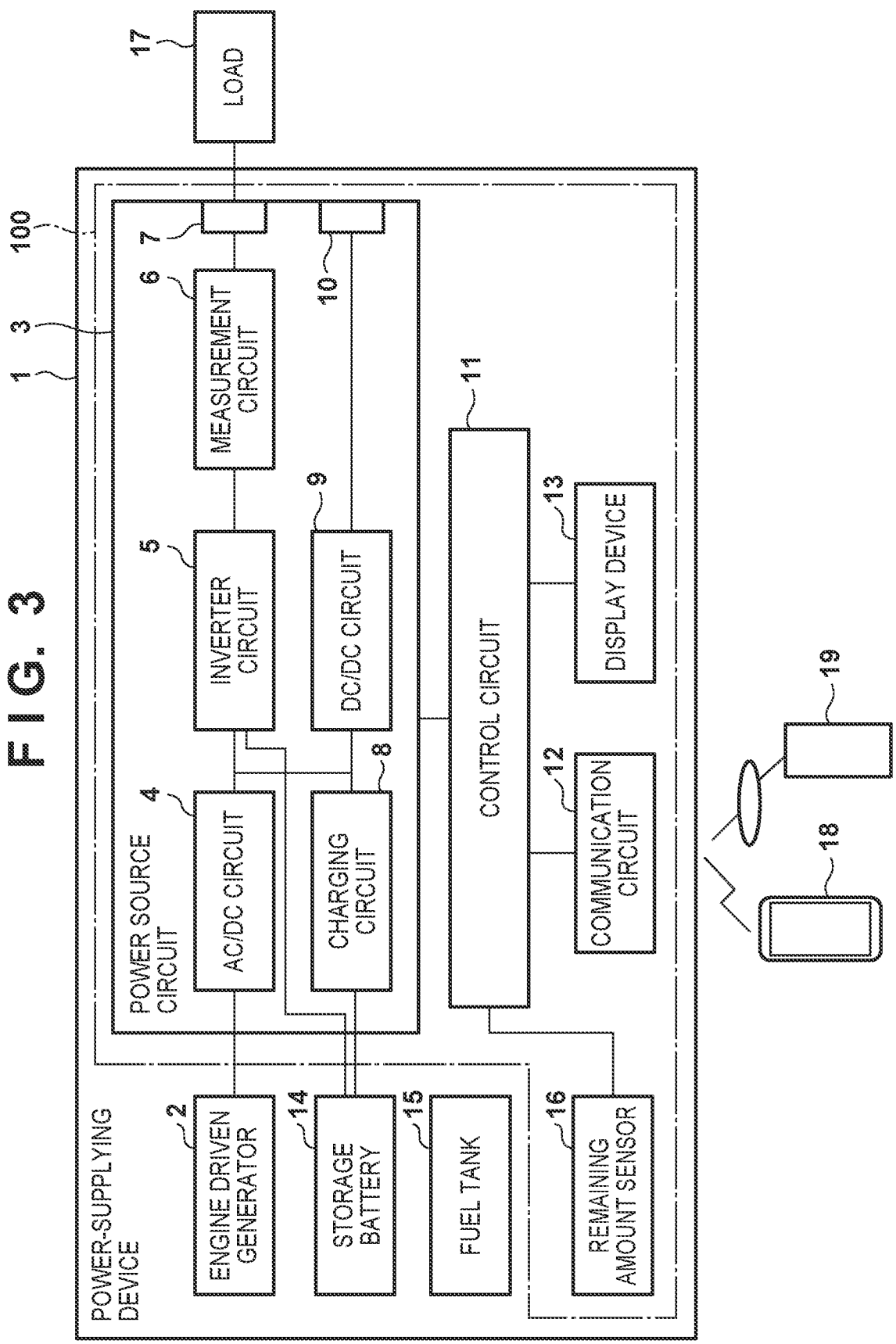
FIG. 3 is a diagram illustrating an example of the configuration of a power-supplying device.

FIG. 3 illustrates a power-supplying device 1 which includes both the engine-driven generator 2 and the storage battery 14. Parts in FIG. 3 which are the same as in FIG. 1 and FIG. 2 will not be described here. The remaining amount sensor 16 measures the remaining amount of fuel held in the fuel tank 15, and measures the charge in the storage battery 14. The inverter circuit 5 converts the DC voltage generated by the AC/DC circuit 4 or the DC voltage supplied from the storage battery 14 into AC voltage. A charging circuit 8 charges the storage battery 14 on the basis of power generated by the engine-driven generator 2. The power-supplying device 1 illustrated in FIG. 3 can supply power stored in the storage battery 14 to the load 17 even after the fuel has been exhausted. The control circuit 11 determines the continuous operation time of a load on the basis of the remaining amount of fuel, the charge, the power consumed by the load, and so on.

According to FIG. 1, FIG. 2, and FIG. 3, the power source circuit 3, the control circuit 11, the remaining amount sensor 16, the communication circuit 12, and the display device 13 constitute a load estimation device 100.

Control Circuit

Figure 4:
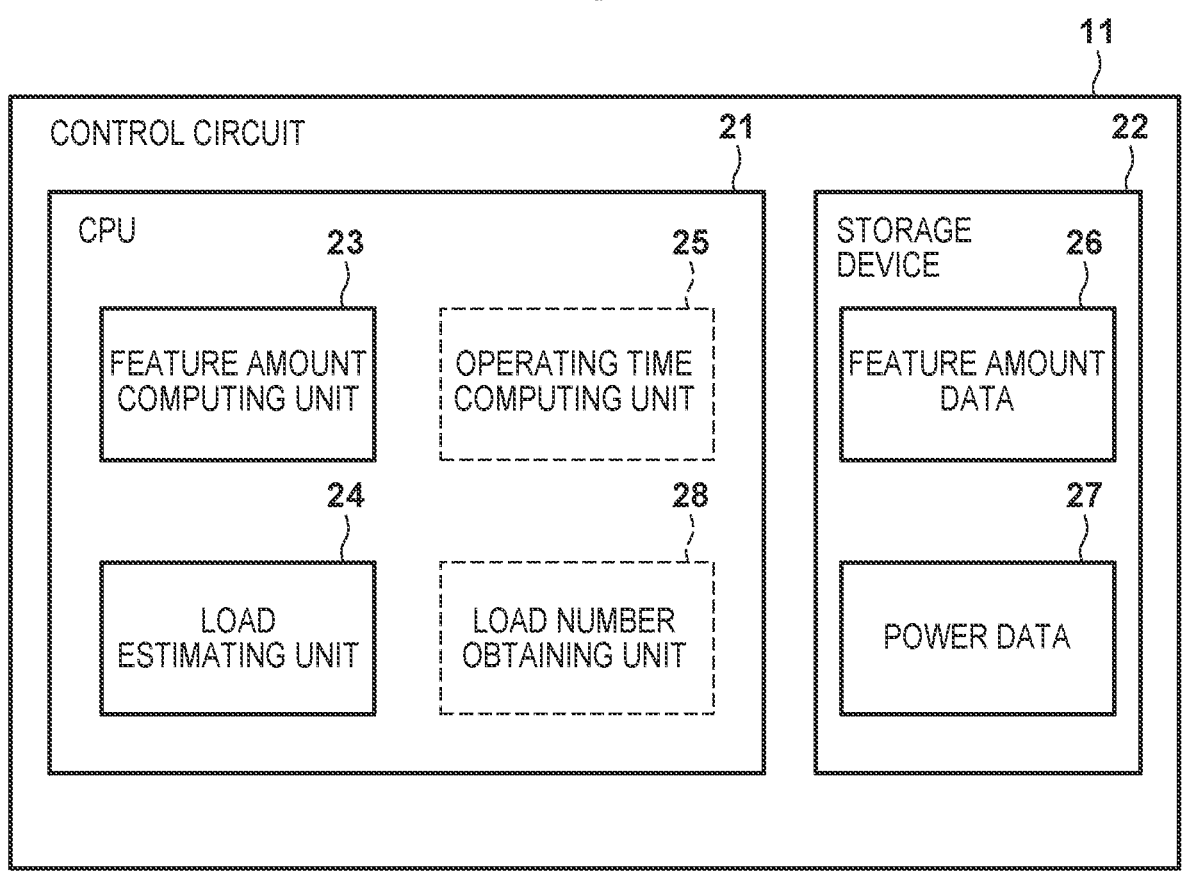
FIG. 4 is a block diagram illustrating a control circuit of a power-supplying device.

FIG. 4 illustrates the control circuit 11. Parts indicated by broken lines in FIG. 4 are optional. A CPU 21 is a processor circuit (a central processing unit) that controls the power-supplying device 1 in accordance with a control program stored in a storage device 22. The storage device 22 is a storage circuit including non-volatile memory (ROM: read-only memory), volatile memory (RAM: random access memory), and so on.

The CPU 21 has a plurality of functions which are realized by executing the control program. Note that some or all of these functions may be realized by hardware circuitry such as DSPs (Digital Signal Processors), FPGAs (Field Programmable Gate Arrays), or the like. A feature amount computing unit 23 computes feature amounts for a plurality of loads on the basis of a measured voltage value and a measured current value measured by the measurement circuit 6. The feature amounts are, for example, an apparent power and a power factor. The power factor is obtained by dividing an effective power by the apparent power, or is found as a cosine ($\cos \theta$) of a phase difference between the voltage and the current. In the latter case, the measurement circuit 6 measures a phase difference $\theta$. Furthermore, the feature amounts may include a stabilization time, which is a time required for a load to reach stable operations after starting up, a peak value of a startup current flowing in the load when the load is started up, and so on. The storage device 22 stores feature amount data 26 and power data 27. The feature amount data 26 is data holding the type or name of a load in association with the feature amounts of the load. Moreover, in the present invention, the feature amount data 26 includes feature amounts for each of combinations of two or more loads. A load estimating unit 24 estimates a plurality of loads connected to the power-supplying device 1 on the basis of the feature amounts computed by the feature amount computing unit 23 and known feature amounts stored in the storage device 22. An operating time calculating unit 25 determines a time for which the plurality of loads can be operated continuously (the continuous operation time) on the basis of the power consumption of the plurality of loads estimated by the load estimating unit 24 and the remaining amount of fuel, the charge, and so on. The CPU 21 may cause the continuous operation time to be displayed in the display device 13, or may transmit the continuous operation time to an external information processing device (communication terminal) through the communication circuit 12 to be displayed in a display of the external information processing device. The power data 27 may include the rated power consumption of each load, the amount of power required by each load to achieve its main objective, and so on. A load number obtaining unit 28 obtains a number of loads connected to the AC outlet 7. The number of loads may be input by the user through an information processing device, or the number of loads may be identified in accordance with a change over time in the current output from the AC outlet 7.

Feature Amount Map

Figure 5:
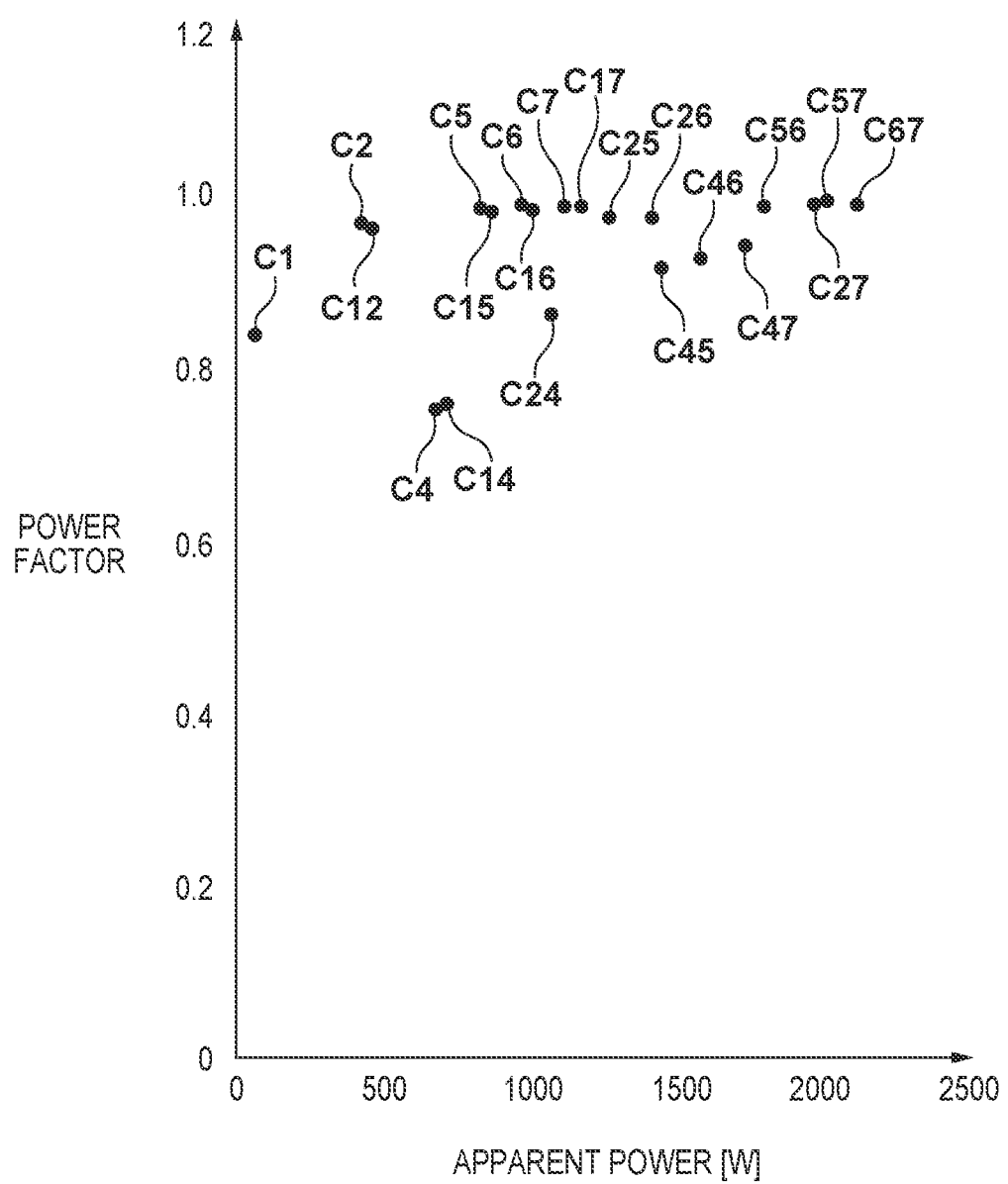
FIG. 5 is a diagram illustrating a feature amount map which can be included in feature amount data.

FIG. 5 illustrates a feature amount map constituting part of the feature amount data 26. Here, the apparent power and the power factor are indicated as feature amounts. In FIG. 5, the dots represent coordinates of the feature amounts of a single load, and coordinates of feature amounts corresponding to combinations of two or more loads. Of course, dots representing coordinates of feature amounts corresponding to combinations of three or more loads complicate the feature amount map, and thus such dots are not shown here.

A feature amount C1 indicates the feature amounts of a lighting fixture only.

A feature amount C2 indicates the feature amounts of a rice cooker only.

A feature amount C4 indicates the feature amounts of a compressor only.

A feature amount C5 indicates the feature amounts of an electric kettle only.

A feature amount C6 indicates the feature amounts of a heater only.

A feature amount C7 indicates the feature amounts of a hair dryer only.

A feature amount C12 indicates the feature amounts of a combination of the lighting fixture and the rice cooker.

A feature amount C14 indicates the feature amounts of a combination of the lighting fixture and the compressor.

A feature amount C15 indicates the feature amounts of a combination of the lighting fixture and the electric kettle.

A feature amount C16 indicates the feature amounts of a combination of the lighting fixture and the heater.

A feature amount C17 indicates the feature amounts of a combination of the lighting fixture and the hair dryer.

A feature amount C24 indicates the feature amounts of a combination of the rice cooker and the compressor.

A feature amount C25 indicates the feature amounts of a combination of the rice cooker and the electric kettle.

A feature amount C26 indicates the feature amounts of a combination of the rice cooker and the heater.

A feature amount C27 indicates the feature amounts of a combination of the rice cooker and the hair dryer.

A feature amount C45 indicates the feature amounts of a combination of the compressor and the electric kettle.

A feature amount C46 indicates the feature amounts of a combination of the compressor and the heater.

A feature amount C47 indicates the feature amounts of a combination of the compressor and the hair dryer.

A feature amount C56 indicates the feature amounts of a combination of the electric kettle and the heater.

A feature amount C57 indicates the feature amounts of a combination of the electric kettle and the hair dryer.

A feature amount C67 indicates the feature amounts of a combination of the heater and the hair dryer.

The load estimating unit 24 calculates a distance between the coordinates of the feature amounts calculated by the feature amount computing unit 23 and the coordinates of the feature amounts stored in the storage device 22, and identifies the coordinates of the feature amounts stored in the storage device 22 which have the minimum distance. Furthermore, the load estimating unit 24 identifies the type, name, and so on (identification information) of the load associated with the specified feature amounts. For example, if the feature amounts having the minimum distance are indicated by C56, the load estimating unit 24 extracts, from the feature amount data 26, "electric kettle" and "heater" as the identification information of the loads corresponding to C56. Note that although Ci or Cij are used as signs for identifying the feature amounts, Ci is used to identify a single load, whereas Cij is used to identify a combination of two loads. According to this naming rule, Cijk is used as a sign for identifying a combination of three loads. Likewise, Cijkl is used as a sign for identifying a combination of four loads. The same naming rule may be used for combinations of five or more loads as well. Note that a feature amount Cij corresponds to a vector combination of a feature amount Ci and a feature amount Cj. If the load number obtaining unit 28 has obtained the number of loads, the load estimating unit 24 may narrow down the loads for comparison to only the combinations of feature amounts corresponding to that number of loads. Thus if the number of loads is 2, Cij is subject to the comparison. Likewise, if the number of loads is 4, Cijkl is subject to the comparison.

Power Data

The operating time calculating unit 25 calculates a remaining operating time (h) basically from an instantaneous value (W) of the power consumed by all the loads at present and a suppliable power amount (Wh) found from the remaining amount of fuel, the charge, and so on, and outputs the remaining operating time to the display device 13 or the communication circuit 12 from time to time. However, the operating time calculating unit 25 may find the continuous operation time using a method such as that described below.

FIG. 6 illustrates an example of the power data 27. The power data 27 holds the rated power consumption and a typical power amount for each load. The "typical power amount" is a minimum power amount required for the electrical device to achieve its main objective (typical task). For example, the typical power amount of a rice cooker is the amount of power required from the start to the end of cooking rice. For example, when the load estimating unit 24 estimates that the plurality of loads connected to the power-supplying device 1 are an electric kettle and a rice cooker, the operating time calculating unit 25 refers to the power data 27, obtains the rated power consumption of the electric kettle and the rated power consumption of the rice cooker, and adds the rated power consumptions together. The operating time calculating unit 25 calculates the suppliable power amount from the remaining amount of fuel, the charge, and so on. Furthermore, the operating time calculating unit 25 calculates the continuous operation time by dividing the suppliable power amount by the sum of the rated power consumption of the electric kettle and the rated power consumption of the rice cooker, and outputs the continuous operation time to the display device 13 or the communication circuit 12. Alternatively, the operating time calculating unit 25 calculates the suppliable power amount from the remaining amount of fuel, the charge, or the like, and if the sum of the typical power amount of the electric kettle and the typical power amount of the rice cooker is equal to or lower than the suppliable power amount, outputs, to the display device 13 or the communication circuit 12, information indicating that the electric kettle and the rice cooker can achieve their main objectives. If the sum of the typical power amount of the electric kettle and the typical power amount of the rice cooker is higher than the suppliable power amount, the operating time calculating unit 25 outputs, to the display device 13 or the communication circuit 12, information (a warning message or the like) indicating that the electric kettle and the rice cooker cannot achieve their main objectives. The warning message may be output from a speaker, a buzzer, or the like as an audio message, a warning sound, or the like.

Flowchart of Load Estimating Method

Figure 7:
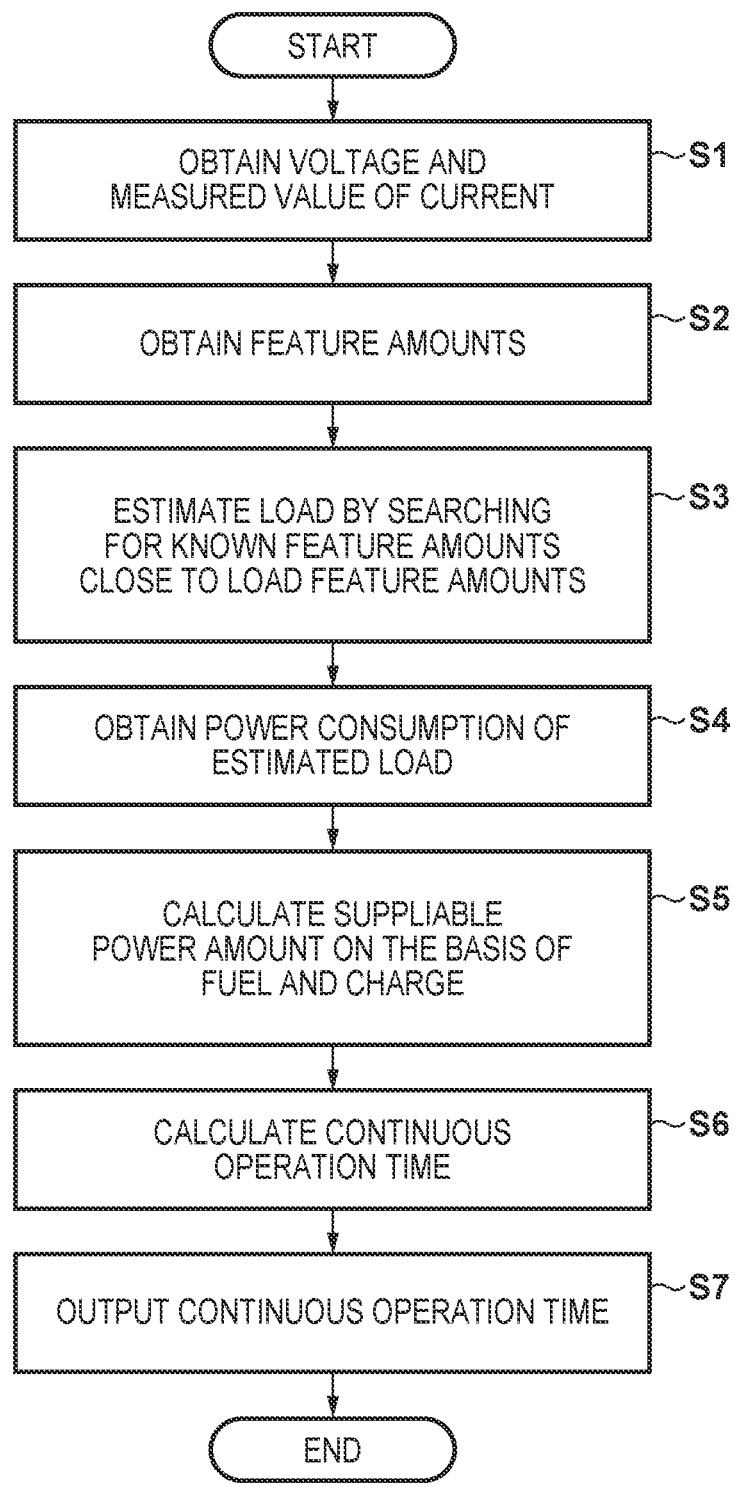
FIG. 7 is a flowchart illustrating a load estimating method.

FIG. 7 illustrates a load estimating method executed by the CPU 21 in accordance with a control program.

In S1, the CPU 21 (the feature amount computing unit 23) obtains the measured value of the voltage and the measured value of the current supplied to the load 17 using the measurement circuit 6.

In S2, the CPU 21 (the feature amount computing unit 23) obtains the feature amounts (e.g., the power factor, the apparent power, and the like) of the load 17 using the measured values for the voltage and the current.

In S3, the CPU 21 (the load estimating unit 24) estimates the load 17 by searching for known feature amounts resembling the feature amounts of the load 17. As described above, the storage device 22 stores the feature amount data 26, which includes known feature amounts. Accordingly, the load estimating unit 24 specifies known feature amounts resembling the feature amounts of the load 17 from the feature amount data 26, and obtains the identification information of a load associated with the specified known feature amounts. The identification information of the load may be the name or type of the load, Ci, Cij, or the like, for example.

In S4, the CPU 21 (the load estimating unit 24 or the operating time calculating unit 25) obtains the power consumption of the estimated load from the power data 27. As illustrated in FIG. 6, the power data 27 holds the rated power consumption corresponding to the identification information of the load. As such, the operating time calculating unit 25 obtains, from the power data 27, the rated power consumption corresponding to the identification information of the load. When the load estimating unit 24 has estimated a combination of a plurality of loads (e.g., when Cij, Cijk, or the like has been estimated), the operating time calculating unit 25 obtains, from the power data 27, the rated power consumption of each of the plurality of loads.

In S5, the CPU 21 (the operating time calculating unit 25) finds the suppliable power amount from the power-supplying device 1. With the power-supplying device 1 illustrated in FIG. 1, the operating time calculating unit 25 computes the suppliable power amount from the power-supplying device 1 on the basis of the remaining amount of fuel sensed by the remaining amount sensor 16. With the power-supplying device 1 illustrated in FIG. 2, the operating time calculating unit 25 computes the suppliable power amount from the power-supplying device 1 on the basis of the charge in the storage battery 14 sensed by the remaining amount sensor 16. With the power-supplying device 1 illustrated in FIG. 3, the operating time calculating unit 25 computes the suppliable power amount from the power-supplying device 1 on the basis of the remaining amount of fuel sensed by the remaining amount sensor 16 and the charge in the storage battery 14 sensed by the remaining amount sensor 16. Note that equations or functions that convert the measurement result from the remaining amount sensor 16 into a power amount may be stored in the storage device 22.

In S6, the CPU 21 (the operating time calculating unit 25) finds the continuous operation time for the estimated load by dividing the suppliable power amount by the rated power consumption of the load. Note that an instantaneous value of the overall power consumption of the load may be used instead of the rated power consumption of the load. The continuous operation time is a time for which the estimated load can operate continuously (continually).

In S7, the CPU 21 (the operating time calculating unit 25) outputs the continuous operation time to the display device 13, the communication circuit 12, or the like. The operating time calculating unit 25 may output the identification information of the load along with the continuous operation time. Additionally, the operating time calculating unit 25 may determine whether the estimated load can complete its main objective (a typical task of the load) by determining whether or not the suppliable power amount is greater than or equal to the typical power amount of the estimated load. If the suppliable power amount is less than the typical power amount of the estimated load, the operating time calculating unit 25 may output a warning indicating that the estimated load will be unable to complete its main objective (a typical task of the load). For example, a warning indicating that a rice cooker will not be able to finish cooking rice may be output.

Load Predicting Method

A load connected to the power-supplying device 1 can be estimated through the load estimating method described above. Incidentally, because the load estimating method estimates the load connected to the power-supplying device 1 on the basis of feature amounts of the load, a load not connected to the power-supplying device 1 cannot be estimated. This is due to the fact that there is no unit configured to obtain the feature amounts of loads not connected to the power-supplying device 1. In other words, the load estimating method cannot estimate a load which may be connected to the power-supplying device 1.

It would be convenient to be able to predict a load that will be connected to the power-supplying device 1 in the near future (several minutes to several tens of minutes later). For example, if a rice cooker is connected to the power-supplying device 1 at a camping ground, it is possible that cooking equipment for preparing a side dish or the like (e.g., a hot plate or the like) will be connected to the power-supplying device 1 next. Furthermore, if cooking equipment has been connected to the power-supplying device 1 at a camping ground, it is possible that an electric pot for making a post-meal drink (e.g., coffee, black tea, green tea, or the like) will be connected to the power-supplying device 1 as well. In this manner, the loads which are connected to the power-supplying device 1 vary and increase in number as time passes.

As illustrated in FIG. 3, the power-supplying device 1 may include a generator and a storage battery. Although this power-supplying device 1 can supply power to the rice cooker using only the generator, it may not be possible to supply sufficient power to both the rice cooker and the cooking equipment using the generator alone. Accordingly, the power-supplying device 1 may use both the generator and the storage battery to supply a sufficient amount of power to these loads. However, if the storage battery does not have a sufficient amount of power to supply the amount of power required by the cooking equipment, the user may be unable to finish preparing their food. In this case, the power-supplying device 1 charges the storage battery in advance using the generator. This will make it possible for the user to finish preparing their food. In this manner, there is an advantage to predicting loads which have not yet been connected to the power-supplying device 1.

Figure 8:
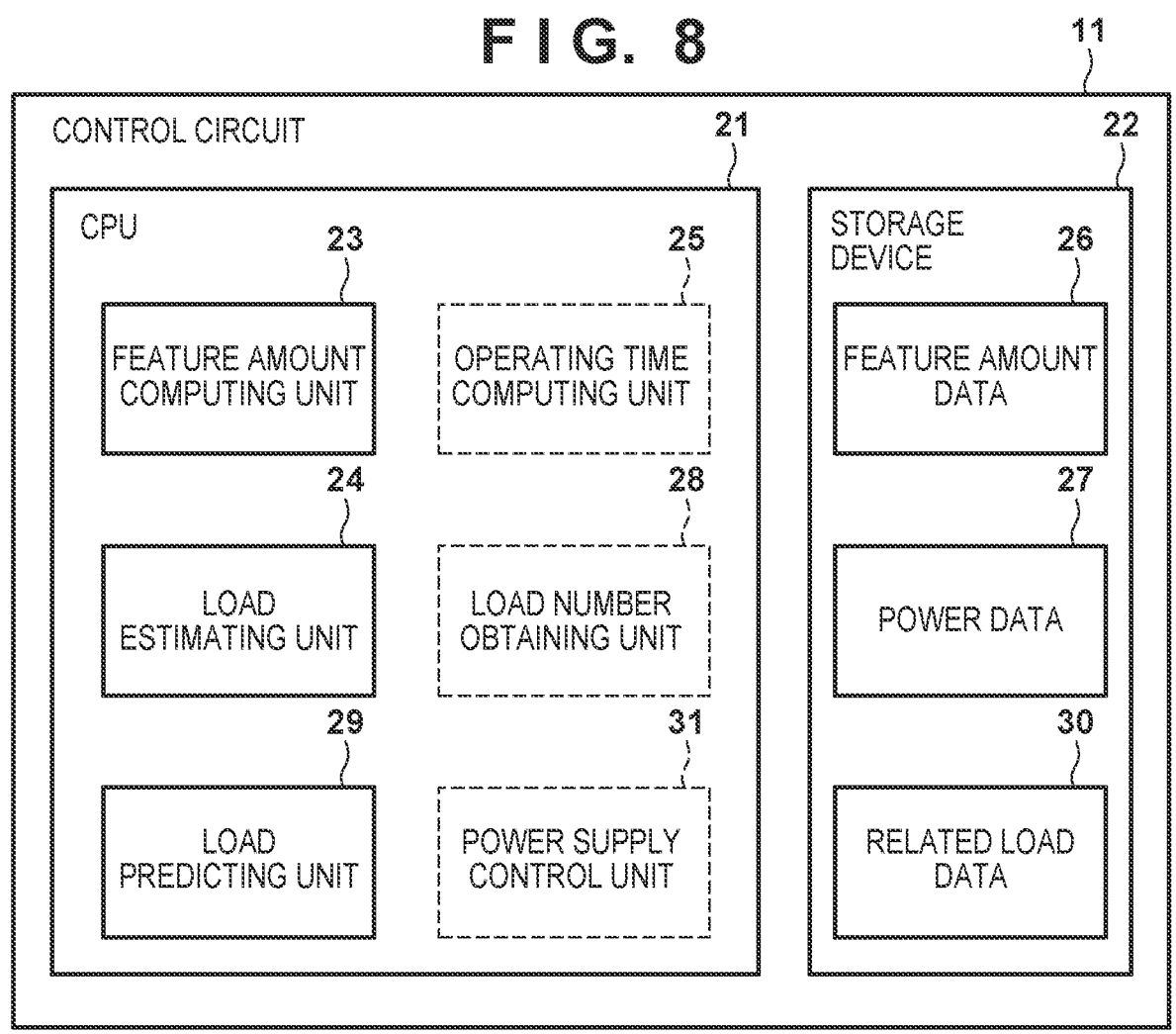
FIG. 8 is a block diagram illustrating a control circuit of a power-supplying device.

FIG. 8 illustrates a control circuit 11 having a load prediction function. The CPU 21 functions as a load predicting unit 29, a power supply control unit 31, and the like by executing control programs stored in the storage device 22. The load predicting unit 29, the power supply control unit 31, and the like may also be realized by hardware circuitry such as FPGAs, as described above. The storage device 22 stores related load data 30. On the basis of the related load data 30, the load predicting unit 29 predicts an unconnected load which is used in association with a load estimated by the load estimating unit 24. The related load data 30 is stored in association with the identification information of a plurality of loads which are used in association with each other. For example, the storage device 22 stores the identification information of a rice cooker and the identification information of a hot plate in association with each other. The power supply control unit 31 determines whether or not the power-supplying device 1 can supply a sufficient amount of power to the estimated load and the predicted load, for example. The power supply control unit 31 also controls the power source circuit 3 to supply power to the load 17 from one of the engine-driven generator 2 and the storage battery 14, supply power to the load 17 from both the engine-driven generator 2 and the storage battery 14, and so on. The power supply control unit 31 may supply power to the load 17 by putting AC voltage supplied from another power-supplying device 1 through the AC/DC circuit 4, the inverter circuit 5, and the like.

Figure 9:
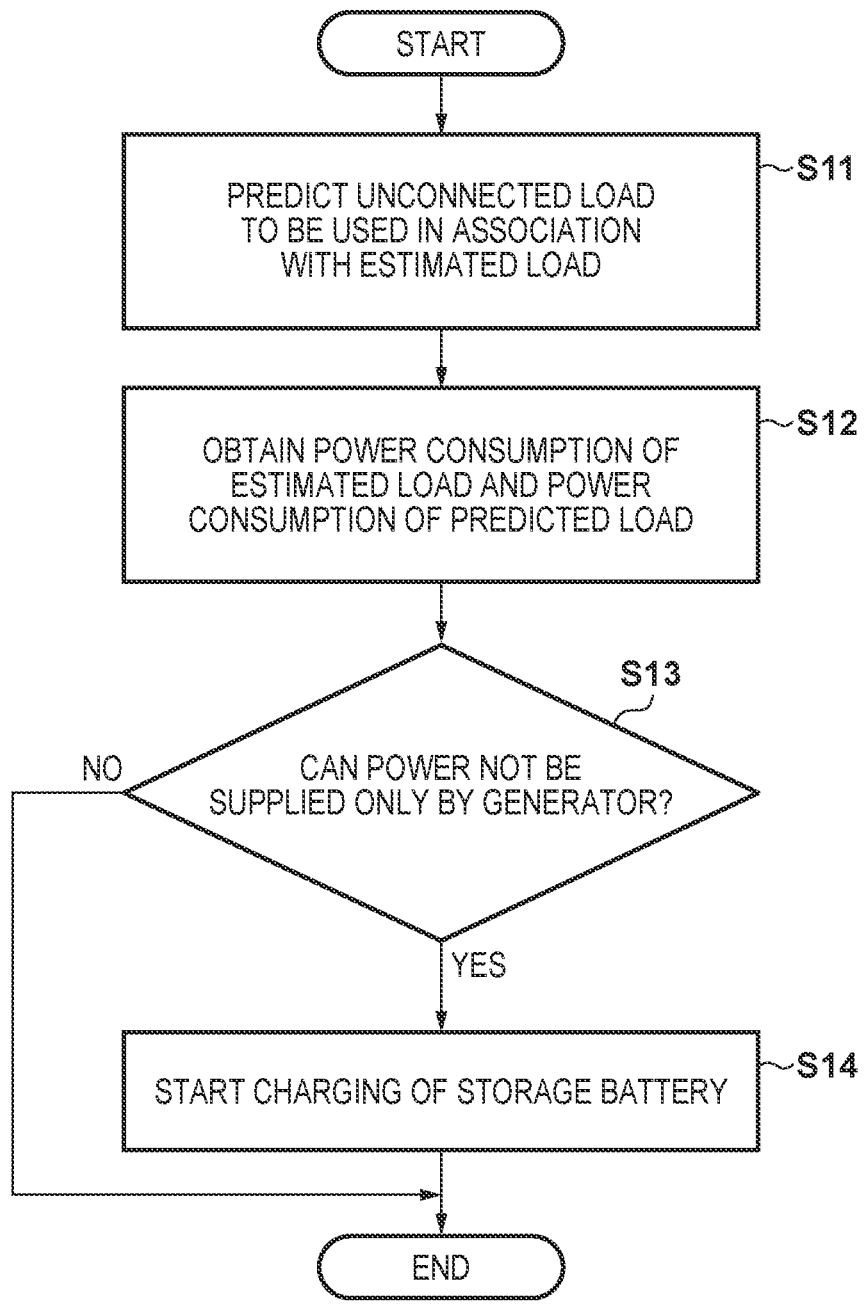
FIG. 9 is a flowchart illustrating a load predicting method.

FIG. 9 is a flowchart illustrating the load predicting method. It is assumed here that S1 to S3 have already been executed. A feature of this load predicting method is that when power cannot be supplied to a predicted load using the generator alone, charging of the storage battery 14 is started before the predicted load is actually connected.

In S11, on the basis of the related load data 30, the CPU 21 (the load predicting unit 29) predicts an unconnected load which is used in association with a load estimated by the load estimating unit 24. For example, the load predicting unit 29 obtains, from the related load data 30, the identification information of another load stored in association with the identification information of the estimated load.

In S12, the CPU 21 (the power supply control unit 31) obtains, from the power data 27, the power consumption of the estimated load and the power consumption of the predicted load. As illustrated in FIG. 6, the power data 27 holds the rated power consumption corresponding to the identification information of the load. As such, the power supply control unit 31 obtains, from the power data 27, the rated power consumption corresponding to the identification information of the load.

In S13, the CPU 21 (the power supply control unit 31) determines whether or not a sufficient amount of power can be supplied to the estimated load and the predicted load using the engine-driven generator 2 alone. For example, if the sum of the power consumption of the estimated load and the power consumption of the predicted load is less than or equal to the power generating capability (rated output power) of the engine-driven generator 2, the power supply control unit 31 determines that power can be supplied to the load. If the sum of the power consumption of the estimated load and the power consumption of the predicted load is greater than the power generating capability (rated output power) of the engine-driven generator 2, the power supply control unit 31 determines that power cannot be supplied to the load. If power can be supplied to the load, the CPU 21 skips S14 and ends the load predicting method. However, if the power cannot be supplied to the load, the CPU 21 moves the sequence to S14.

In S14, the CPU 21 (the power supply control unit 31) controls the charging circuit 8 to start charging the storage battery 14 using some of the power generated by the engine-driven generator 2. Note that when it is recognized, on the basis of the estimation result from the load estimating unit 24, that the predicted load has actually been connected, the power supply control unit 31 controls the power source circuit 3 to supply power to the load from both the engine-driven generator 2 and the storage battery 14. Charging the storage battery 14 beforehand in this manner makes it possible to prepare to supply power to the predicted load. It is therefore less likely that the power-supplying device 1 will have insufficient power when the predicted load is actually connected to the power-supplying device 1.

Figure 10:
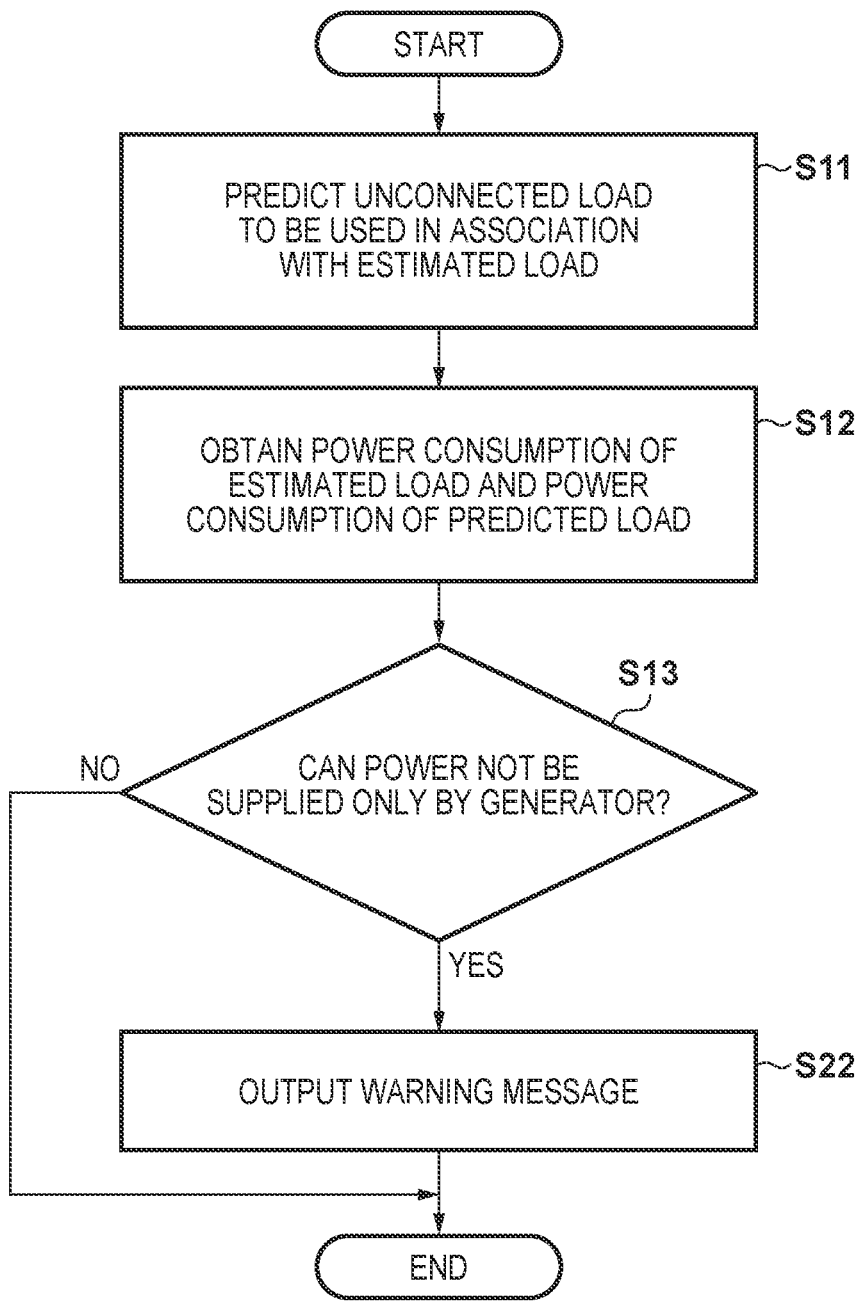
FIG. 10 is a flowchart illustrating a load predicting method.

FIG. 10 is a flowchart illustrating another load predicting method. A feature of this load predicting method is that when power cannot be supplied to a predicted load using the generator alone, a warning message is output. FIG. 10 replaces S14 in FIG. 9 with S22. When a sufficient amount of power cannot be supplied to the estimated load and the predicted load using the engine-driven generator 2 alone, the CPU 21 moves the sequence to S22.

In S22, the CPU 21 (the power supply control unit 31) outputs the warning message to the display device 13 or the communication circuit 12. The message output to the communication circuit 12 is displayed in a display device of the smartphone 18, the PC 19, or the like. The warning message is a message indicating that the power of the power-supplying device 1 will be insufficient if the predicted load is connected to the power-supplying device 1. In response, the user may take action so as not to connect a plurality of loads to the power-supplying device 1 simultaneously. For example, in response to the message, the user may disconnect a first load (e.g., a rice cooker) from the power-supplying device 1 and then connect a second load (e.g., a hot plate) to the power-supplying device 1.

Figure 11:
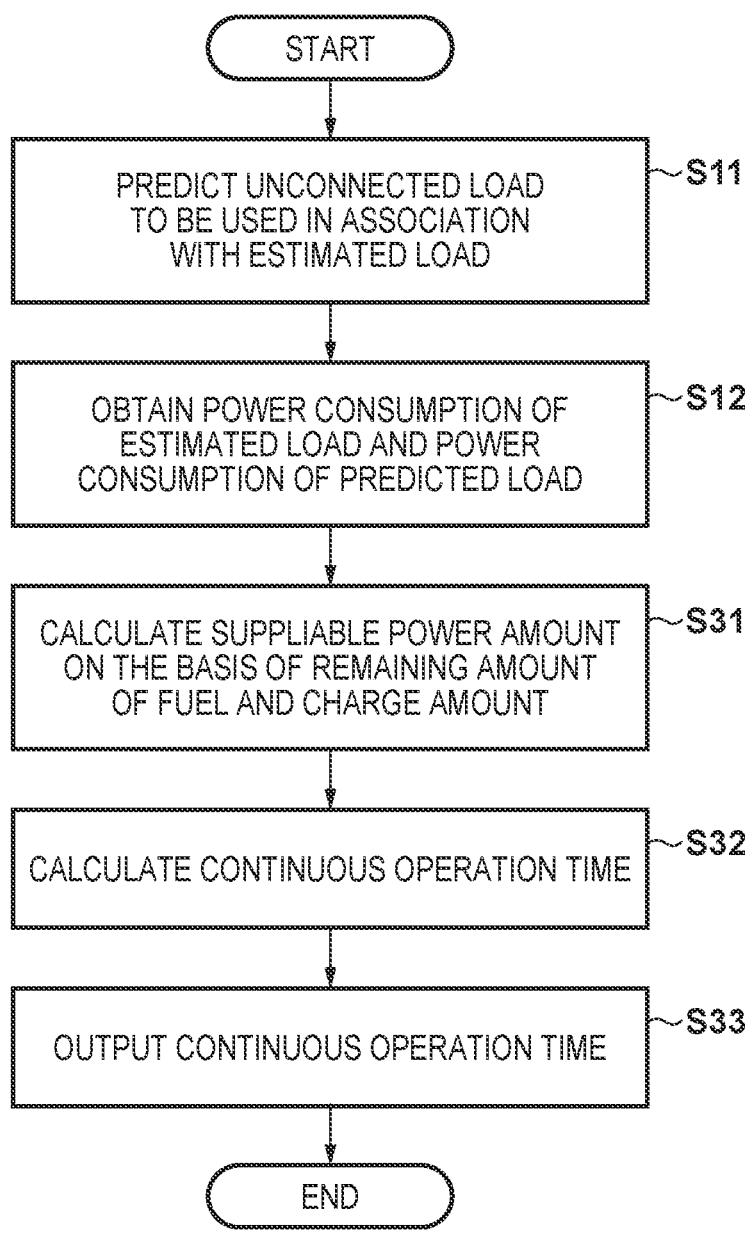
FIG. 11 is a flowchart illustrating a load predicting method.

FIG. 11 is a flowchart illustrating another load predicting method. After S12, the CPU 21 moves the sequence to S31. S31 to S33 are similar to S5 to S7 indicated in FIG. 7. A feature of this load predicting method is that the continuous operation time for when an estimated load and a predicted load have been connected to the power-supplying device 1 is provided to the user.

In S31, the CPU 21 (the operating time calculating unit 25) finds the suppliable power amount from the power-supplying device 1. With the power-supplying device 1 illustrated in FIG. 1, the operating time calculating unit 25 computes the suppliable power amount from the power-supplying device 1 on the basis of the remaining amount of fuel sensed by the remaining amount sensor 16. With the power-supplying device 1 illustrated in FIG. 2, the operating time calculating unit 25 computes the suppliable power amount from the power-supplying device 1 on the basis of the charge in the storage battery 14 sensed by the remaining amount sensor 16. With the power-supplying device 1 illustrated in FIG. 3, the operating time calculating unit 25 computes the suppliable power amount from the power-supplying device 1 on the basis of the remaining amount of fuel sensed by the remaining amount sensor 16 and the charge in the storage battery 14 sensed by the remaining amount sensor 16. Note that equations or functions that convert the measurement result from the remaining amount sensor 16 into a power amount may be stored in the storage device 22.

In S32, the CPU 21 (the operating time calculating unit 25) finds the continuous operation time for the loads by dividing the suppliable power amount by the rated power consumption of the load. Here, "loads" refers to both the estimated load and the predicted load. The operating time calculating unit 25 obtains, from the power data 27, the rated power consumption of the estimated load and the rated power consumption of the predicted load, and finds the sum thereof. Furthermore, the operating time calculating unit 25 finds the continuous operation time by dividing that sum by the suppliable power amount.

In S33, the CPU 21 (the operating time calculating unit 25) outputs the continuous operation time to the display device 13, the communication circuit 12, or the like. The message output to the communication circuit 12 is displayed in a display device of the smartphone 18, the PC 19, or the like. The operating time calculating unit 25 may output the identification information of the load along with the continuous operation time. The operating time calculating unit 25 may output both the continuous operation time for when only the estimated load is used, and the continuous operation time for when both the estimated load and the predicted load are used. Additionally, the operating time calculating unit 25 may determine whether or not the suppliable power amount is greater than or equal to a sum of the typical power amount of the estimated load and the typical power amount of the predicted load. As a result, the operating time calculating unit 25 may determine whether or not the main objectives of the estimated load and the predicted load (the typical tasks of the loads can be completed. If the suppliable power amount is less than the sum, the operating time calculating unit 25 may output a warning indicating that the loads will be unable to complete their main objectives (the typical tasks of the loads). For example, a warning indicating that the rice cooker will not be able to finish cooking rice, or that the hot plate will not be able to finish cooking, may be output.

Figure 12:
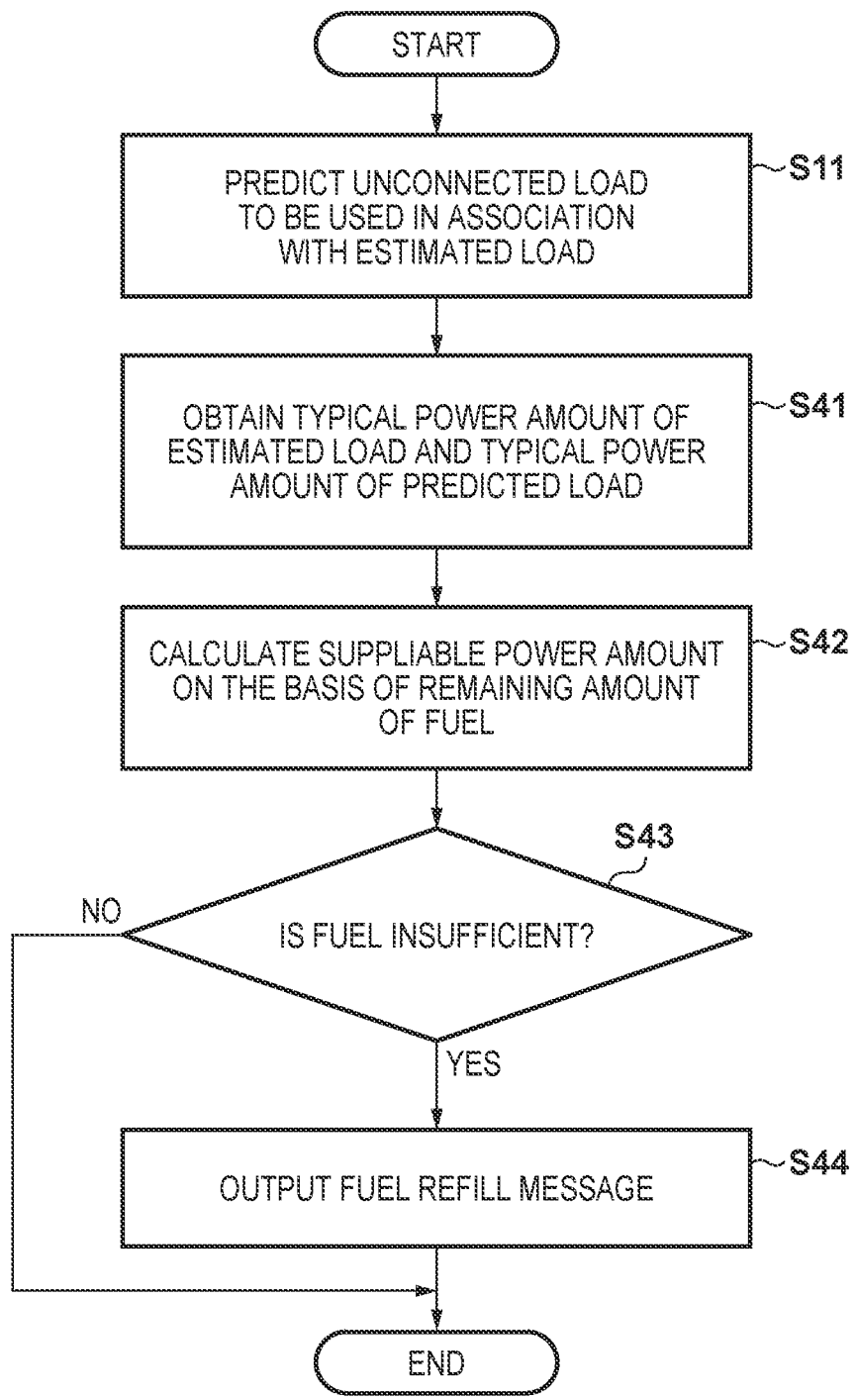
FIG. 12 is a flowchart illustrating a load predicting method.

FIG. 12 is a flowchart illustrating another load predicting method. This load predicting method can be executed by the power-supplying device 1 that includes the engine-driven generator 2. The CPU 21 moves the sequence to S41 after executing S11. A feature of this load predicting method is that the user is warned if it is possible that there will be insufficient fuel when an estimated load and a predicted load have been connected to the power-supplying device 1. In other words, the user can be prompted to refill the fuel.

In S41, the CPU 21 (the power supply control unit 31) obtains, from the power data 27, the typical power amount of the estimated load and the typical power amount of the predicted load.

In S42, the CPU 21 (the power supply control unit 31) computes the suppliable power amount from the power-supplying device 1 on the basis of the remaining amount of fuel sensed by the remaining amount sensor 16.

In S43, the CPU 21 (the power supply control unit 31) determines whether or not the fuel is insufficient on the basis of whether or not the sum of the typical power amount of the estimated load and the typical power amount of the predicted load is less than or equal to the suppliable power amount. If the fuel is not insufficient, the CPU 21 skips S44 and ends the load predicting method. However, if the fuel is insufficient, the CPU 21 moves the sequence to S44.

In S44, the CPU 21 (the power supply control unit 31) outputs a fuel refill message to the display device 13, the communication circuit 12, or the like. The message output to the communication circuit 12 is displayed in a display device of the smartphone 18, the PC 19, or the like. The fuel refill message is a message prompting the user to refill the fuel tank 15 with fuel.

Figure 13:
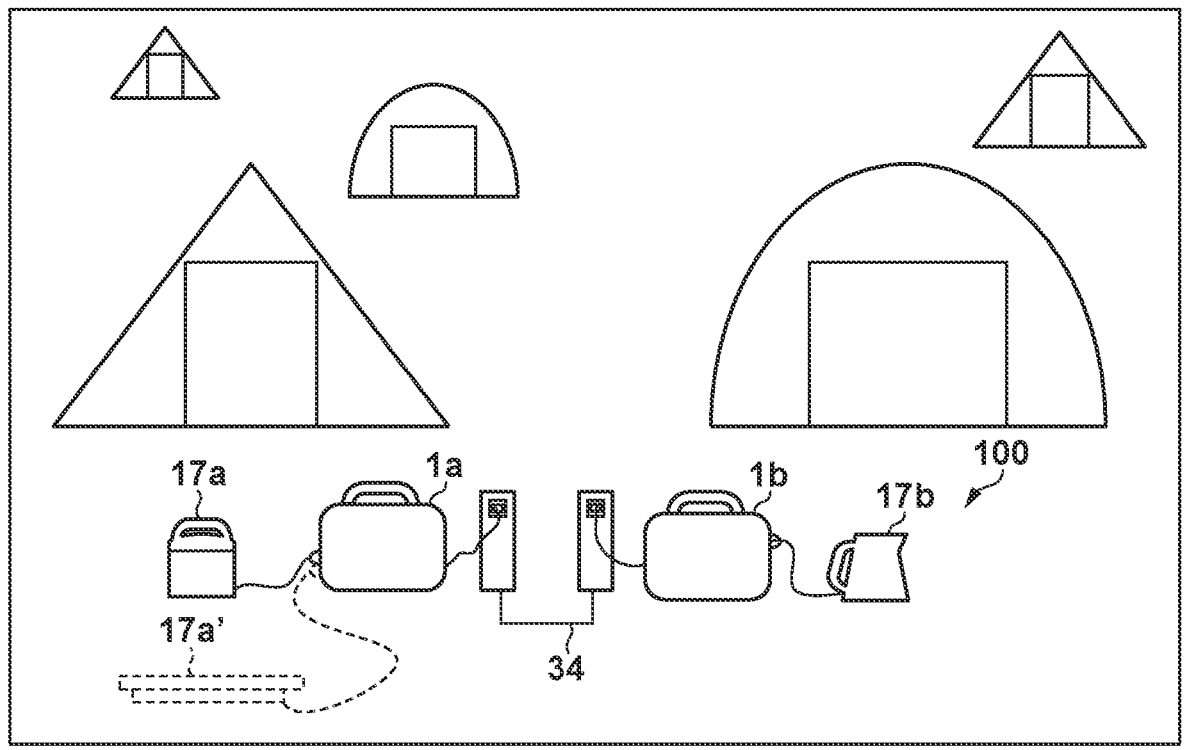
FIG. 13 is a diagram illustrating a power supply system that supplies and receives excess power between a plurality of power-supplying devices.

Note that when a message has been output in S22, S44, or the like, the user may receive a supply of excess power from the power-supplying device 1 of another user. As illustrated in FIG. 13, many users have power-supplying devices 1 at a camping ground. Accordingly, a user "a" who has insufficient power may receive a supply of excess power from another user "b". In FIG. 13, a plurality of power-supplying devices 1a and 1b are connected by a power line 34, and the plurality of power-supplying devices 1a and 1b may supply/receive excess power to/from each other. For example, the power-supplying device 1a has a low power generating capability, and the power-supplying device 1b has a high power generating capability. Alternatively, the power-supplying device 1a can supply power sufficient for a load 17a (e.g., a rice cooker), but will have insufficient power when a predicted load 17a' (a hot plate) is connected. On the other hand, the power-supplying device 1b is supplying power to a load 17b (e.g., an electric kettle) only, and therefore has excess power. In this case, the power-supplying device 1a may receive excess power from the power-supplying device 1b and supply that power to the loads 17a and 17a'.

CONCLUSION

According to a first aspect, the load estimation device 100 is provided. The measurement circuit 6 is an example of a measuring unit configured to measure a voltage and a current supplied one or more loads connected to the power-supplying device 1. The feature amount computing unit 23 is an example of a computing unit (e.g. one or more processors) configured to compute or obtain or determine a feature amount for one or more loads on the basis of a measured value of the voltage and a measured value of the current calculated by the measuring circuit. The storage device 22 is an example of a storage device configured to store, in advance, a feature amount for each of one, or a combination of two or more, loads. The storage device 22 is an example of a storage device configured to store, in advance, related load information indicating a plurality of loads which are used in association with each other. The load estimating unit 24 is an example of a load estimating unit (e.g. one or more processors) configured to estimate or determine one or more loads connected to the power-supplying device 1 on the basis of the feature amount computed or obtained or determined by the computing unit and a feature amount stored in the storage device. The load predicting unit 29 is an example of a load predicting unit (e.g. one or more processors) configured to, on the basis of the related load information, predict or determine a load which is not connected to the power-supplying device 1 and which is a load related to the load estimated or determined by the load estimating unit. The related load data 30 is an example of the related load information. According to the first aspect, one or more loads can be estimated accurately through a simple method, and a load not connected to the power-supplying device 1 can be predicted from the estimated load.

According to a second aspect, the load estimation device 100 may further include: a generator (e.g., the engine-driven generator 2) provided in the power-supplying device 1; a storage battery 14 provided in the power-supplying device and charged by the generator; a judging unit (e.g., the operating time calculating unit 25, the power supply control unit 31, and the like) configured to judge, on the basis of a power consumption of the load estimated by the load estimating unit, a power consumption of the load predicted by the load predicting unit, and a power generating capability to the generator, whether or not the generator can supply a sufficient amount of power to the load estimated by the load estimating unit and the load predicted by the load predicting unit; and a control unit (e.g., the power supply control unit 31) configured to control a supply of power to the loads from the generator and the storage battery. When the judging unit judges that the generator cannot supply a sufficient amount of power to the load estimated by the load estimating unit and the load predicted by the load predicting unit, the power supply control unit 31 starts charging the storage battery using the generator. Through this, power is supplied to the predicted load from both the generator and the storage battery when the predicted load is actually connected to the power-supplying device 1.

According to a third aspect, the remaining amount sensor 16 is an example of a sensor (sensing unit) configured to sense a remaining amount of fuel held in the fuel tank 15 of the generator. The operating time calculating unit 25 is an example of a determining unit configured to determine, on the basis of a power consumption of the load estimated by the load estimating unit, a power consumption of the load predicted by the load predicting unit, and the remaining amount of fuel, a time for which the estimated load and the predicted load can operate continuously. The communication circuit 12, the display device 13, and the like are examples of an output unit configured to output the time for which the estimated load and the predicted load can operate continuously. Through this, the user can understand the time for which the estimated load and the predicted load can operate continuously.

According to a fourth aspect, the power-supplying device 1 may further include the storage battery 14 which is charged by the generator. The operating time calculating unit 25 may determine, on the basis of a power consumption of the load estimated by the load estimating unit, a power consumption of the load predicted by the load predicting unit, the remaining amount of fuel, and a charge in the storage battery, a time for which the load estimated by the load estimating unit and the load predicted by the load predicting unit can operate continuously. In this manner, the time for which the loads can operate continuously may take the charge in the storage battery 14 into account.

According to a fifth aspect, the load estimation device 100 may further include: a generator (e.g., the engine-driven generator 2) provided in the power-supplying device 1; a sensor (e.g., the remaining amount sensor 16) configured to sense a remaining amount of fuel held in the fuel tank 15 of the generator; a judging unit (e.g., the power supply control unit 31) configured to judge, on the basis of a power consumption of the load estimated by the load estimating unit, a power consumption of the load predicted by the load predicting unit, and the remaining amount of fuel, whether or not the fuel tank 15 should be refilled with fuel; and a output unit (e.g., the display device 13) configured to output a message indicating that the fuel tank should be refilled with fuel when the judging unit determines that the fuel tank 15 should be refilled with fuel. Through this, the user can easily know that the fuel should be refilled. This also makes it less likely for the fuel to run out when the estimated load and the predicted load has been connected to the power-supplying device 1.

According to a sixth aspect, the power-supplying device 1 including the load estimation device according to any one of the first to fifth aspects is provided. In this manner, the load estimation device may be provided having been incorporated into the power-supplying device 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A load estimation device comprising:
   a measuring circuit configured to measure a voltage and a current supplied to a load connected to a portable power-supplying device;
   a computing unit configured to compute a feature amount of the load from a measured value of the voltage and a measured value of the current measured by the measuring circuit;
   a storage device configured to store, in advance, a feature amount of each of loads, and related load information indicating a plurality of loads which are used in association with each other;
   a load estimating unit configured to estimate a load connected to the power-supplying device on the basis of the feature amount computed by the computing unit and a feature amount stored in the storage device; and
   a load predicting unit configured to, on the basis of the related load information, predict a load which is not connected to the power-supplying device and which is a load related to the load estimated by the load estimating unit.

2. The load estimation device according to claim 1, further comprising:
   a generator provided in the power-supplying device;
   a storage battery provided in the power-supplying device and charged by the generator;
   a judging unit configured to judge, on the basis of a power consumption of the load estimated by the load estimating unit, a power consumption of the load predicted by the load predicting unit, and a power generating capability to the generator, whether or not the generator can supply a sufficient amount of power to the load estimated by the load estimating unit and the load predicted by the load predicting unit; and
   a control unit configured to control a supply of power to the loads from the generator and the storage battery,
   wherein when the judging unit judges that the generator cannot supply a sufficient amount of power to the load estimated by the load estimating unit and the load predicted by the load predicting unit, the control unit starts charging the storage battery using the generator.

3. The load estimation device according to claim 1, further comprising:
   a generator provided in the power-supplying device;
   a sensor configured to sensing a remaining amount of fuel held in a fuel tank of the generator;
   a determining unit configured to determine, on the basis of a power consumption of the load estimated by the load estimating unit, a power consumption of the load predicted by the load predicting unit, and the remaining amount of fuel, a time for which the load estimated by the load estimating unit and the load predicted by the load predicting unit can operate continuously; and an output unit configured to output the time.

4. The load estimation device according to claim 3, wherein:

the power-supplying device further includes a storage battery which is charged by the generator, and the determining unit is configured to determine, on the basis of the power consumption of the load estimated by the load estimating unit, the power consumption of the load predicted by the load predicting unit, the remaining amount of fuel, and a charge in the storage battery, the time for which the load estimated by the load estimating unit and the load predicted by the load predicting unit can operate continuously.

5. The load estimation device according to claim 1, further comprising:

a generator provided in the power-supplying device;

a sensor configured to sense a remaining amount of fuel held in a fuel tank of the generator;

a judging unit configured to judge, on the basis of a power consumption of the load estimated by the load estimating unit, a power consumption of the load predicted by the load predicting unit, and the remaining amount of fuel, whether or not the fuel tank should be refilled with fuel; and an output unit configured to output a message indicating that the fuel tank should be refilled with fuel when the judging unit determines that the fuel tank should be refilled with fuel.

6. A portable power-supplying device provided with a load estimation device, the load estimation device comprising:

a measuring circuit configured to measure a voltage and a current supplied to a load connected to a portable power-supplying device;

a computing unit configured to compute a feature amount of the load from a measured value of the voltage and a measured value of the current measured by the measuring circuit;

a storage device configured to store, in advance, a feature amount of each of loads, and related load information indicating a plurality of loads which are used in association with each other;

a load estimating unit configured to estimate a load connected to the power-supplying device on the basis of the feature amount computed by the computing unit and a feature amount stored in the storage device; and a load predicting unit configured to, on the basis of the related load information, predict a load which is not connected to the power-supplying device and which is a load related to the load estimated by the load estimating unit.

7. A load estimation device comprising:

a measuring circuit configured to measure a voltage and a current supplied to a load connected to a portable power-supplying device;

one or more processors configured to compute a feature amount of the load from a measured value of the voltage and a measured value of the current measured by the measuring circuit; and a storage device configured to store, in advance, a feature amount of each of loads, and related load information indicating a plurality of loads which are used in association with each other, wherein the one or more processors are further configured to:

estimate a load connected to the power-supplying device on the basis of the feature amount computed by the one or more processors and a feature amount stored in the storage device; and on the basis of the related load information, predict a load which is not connected to the power-supplying device and which is a load related to the load estimated by the one or more processors.

* * * * *